(12) United States Patent
Kordik et al.

(10) Patent No.: US 9,385,700 B2
(45) Date of Patent: Jul. 5, 2016

(54) CLOCK MONITORING FOR SEQUENTIAL LOGIC CIRCUITS

(71) Applicant: Infineon Technologies AG, Neubiberg (DE)

(72) Inventors: Klemens Kordik, Linz (AT); Bernhard Gstoettenbauer, Engerwitzdorf (AT); Klaus Buchner, Steyregg (AT); Thomas Sailer, Zwettl (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/497,360

(22) Filed: Sep. 26, 2014

(65) Prior Publication Data

US 2016/0094212 A1 Mar. 31, 2016

(51) Int. Cl.
*H03K 5/24* (2006.01)
*H03K 4/08* (2006.01)

(52) U.S. Cl.
CPC ... *H03K 5/24* (2013.01); *H03K 4/08* (2013.01)

(58) Field of Classification Search
CPC .......... H03K 5/135; H03K 21/38; H03K 4/08
USPC ..................... 327/77, 108, 109, 309
See application file for complete search history.

(56) References Cited

U.S. PATENT DOCUMENTS 7,750,706 B1 * 7/2010 Cho .................... H03K 5/13
327/147

* cited by examiner

*Primary Examiner* — John Poos
(74) *Attorney, Agent, or Firm* — Eschweiler & Associates, LLC

(57) ABSTRACT

A monitor circuit for monitoring a clock signal is described. In accordance with one example of the disclosure, the monitor circuit includes a pulse generator and a comparator circuit. The pulse generator is configured to generate a sequence of pulses synchronous to the clock signal, wherein each pulse has an edge with a monotonously rising or falling signal level. The comparator circuit receives the sequence of pulses and is configured to detect, for each clock cycle of the clock signal, whether or not the signal level of the sequence of pulses is outside a desired range at a specific time instant within the clock cycle of the clock signal.

12 Claims, 4 Drawing Sheets

CLOCK MONITORING FOR SEQUENTIAL LOGIC CIRCUITS

FIELD

The present disclosure relates to the field of sequential logic circuits.

BACKGROUND

Integrated digital circuits can be found in almost any modern electronic device. These integrated circuits perform a large variety of control, monitoring and communication tasks, and thus determine the behavior of the overall electronic device. In the field of digital circuits, the term "sequential logic" generally relates to a class of logic circuits, whose output signal(s) depend(s) not only on the present value(s) of its input signal(s) but also on the previous value(s) of its input signal(s). This is in contrast to so-called combinational logic, in which output signals are a function of only the present input signals. That is, a sequential logic has state (i.e. a memory), which contributes to the value of its output signal(s), whereas combinational logic does not. Sequential logic circuits may be used to construct finite state machines (FSM), and they are a basic function block in all digital circuitry, as well as memory circuits and other digital electronic devices. Virtually all circuits in digital electronic devices include sequential logic.

Sequential logic circuits may be divided into synchronous and asynchronous circuits. In synchronous sequential circuits, the state of the circuit (and thus the output) changes only at discrete times in response to a clock signal. Such circuits are usually referred to as synchronous sequential logic circuits, which operate synchronously to a clock signal. The clock signal(s) may be provided by an external clock device or may be generated on-chip by a complex clock circuit. When the frequency of the clock signal(s) is not within a specific range, malfunction of the logic circuit may be the result.

In many applications, such as for example automotive radar applications (and also in other fields of technology), synchronous sequential logic circuits are used, inter alia, to perform control and monitoring tasks in electronic devices. Therefore, sequential logic circuits may be relevant to security in many applications. In the automotive sector, many electronic devices have to comply with several standards (such as standard ISO 26262 titled "Road vehicles—Functional safety") with regard to functional safety. Therefore there is a general need to improve or ensure the functional safety of integrated circuits.

SUMMARY

A monitor circuit for monitoring a clock signal is described. In accordance with one example of the disclosure, the monitor circuit comprises a pulse generator and a comparator circuit. The pulse generator is configured to generate a sequence of pulses synchronous to the clock signal, wherein each pulse has an edge with a monotonously rising or falling signal level. The comparator circuit receives the sequence of pulses and is configured to detect, for each clock cycle of the clock signal, whether or not the signal level of the sequence of pulses is outside a desired range at a specific time instant within the clock cycle of the clock signal.

Furthermore, a method for monitoring a clock signal is described. In accordance with another example of the disclosure the method includes generating a sequence of pulses synchronous to the clock signal, wherein each pulse has an edge with a monotonously rising or falling signal level. The method further includes, in each clock cycle of the clock signal, detecting whether or not the signal level of the sequence of pulses is outside a desired range at a specific time instant within the clock cycle of the clock signal.

Furthermore, a circuit arrangement is disclosed which, in accordance with a further example of the disclosure, includes a sequential logic circuit receiving a clock signal, a controller configured to communicate with the sequential logic circuit, and a monitor circuit for monitoring the clock signal. The monitor circuit comprises a pulse generator and a comparator circuit. The pulse generator is configured to generate a sequence of pulses synchronous to the clock signal, wherein each pulse has an edge with a monotonously rising or falling signal level. The comparator circuit receives the sequence of pulses and is configured to detect, for each clock cycle of the clock signal, whether or not the signal level of the sequence of pulses is outside a desired range at a specific time instant within the clock cycle of the clock signal.

BRIEF DESCRIPTION OF THE DRAWINGS

The disclosure can be better understood with reference to the following drawings and descriptions. The components in the figures are not necessarily to scale; in-stead emphasis is placed upon illustrating the principles of the disclosure. More-over, in the figures, like reference numerals designate corresponding parts. In the drawings.

DETAILED DESCRIPTION

Figure 1:
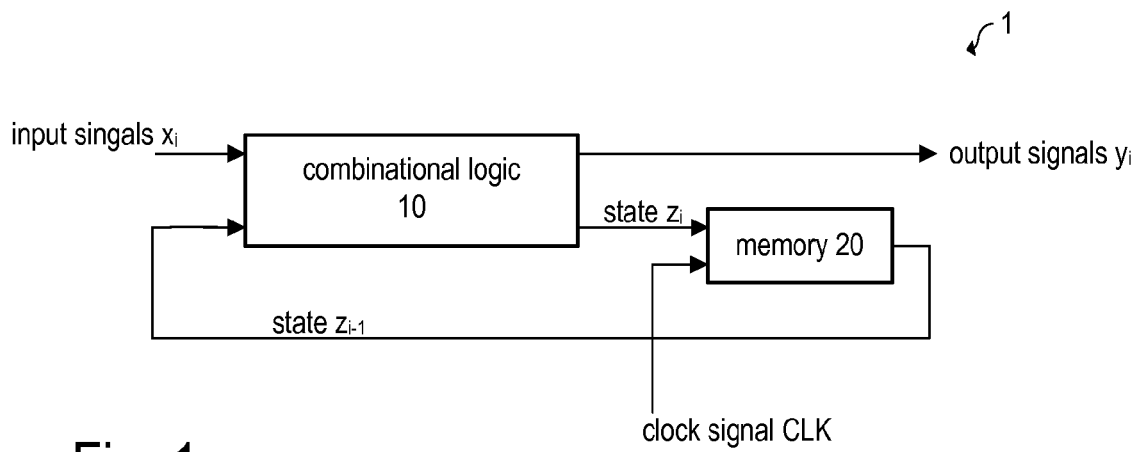
FIG. 1 is a block diagram illustrating an example of a synchronous sequential logic circuit.

FIG. 1 illustrates an example structure of a basic sequential logic circuit. Accordingly, the sequential logic circuit includes a combinational logic circuit 10 and a memory 20. The combinational logic circuit 10 implements a Boolean function $F(x_i, z_{i-1})$. The combinational logic circuit 10 receives one or more input signals $x_i$ and one or more state signals $z_{i-1}$ representing the state of the sequential logic stored in a memory 20. One or more output signals $y_i$ and one or more updated state signals $z_i$ are generated by the combinational logic circuit 10. In each clock cycle i, the stored state $z_{i-1}$ (that is, the state stored in the previous clock cycle) is provided at the output of the memory 20 (and thus applied to the input of the combinational logic circuit 10). The resulting updated state $z_i$, which is provided at the output of the combinational logic circuit 10, is stored in the memory 20 for the subsequent clock cycle. This can be written as:

$$[y_i, z_i] = F(x_i, z_{i-1}), \text{ for } r = 1, 2, 3, \ldots \quad (1)$$

The memory 20 may include one or more edge-triggered flip-flops, which are clocked by the digital (binary) clock signal CLK. For a proper operation of the sequential logic circuit the frequency $f_{CLK}$ of the clock signal CLK has to be within a desired frequency range. If the clock signal fails, the operation of the sequential logic 1 (and all other clocked circuitry) will stop and communication with a higher level controller is not possible. The absence of a clock signal may be easily detected. However, a clock signal CLK having a frequency $f_{CLK}$ outside the desired (allowable) frequency range may cause malfunction of the sequential logic 1, which cannot be detected without further measures.

Figure 2:
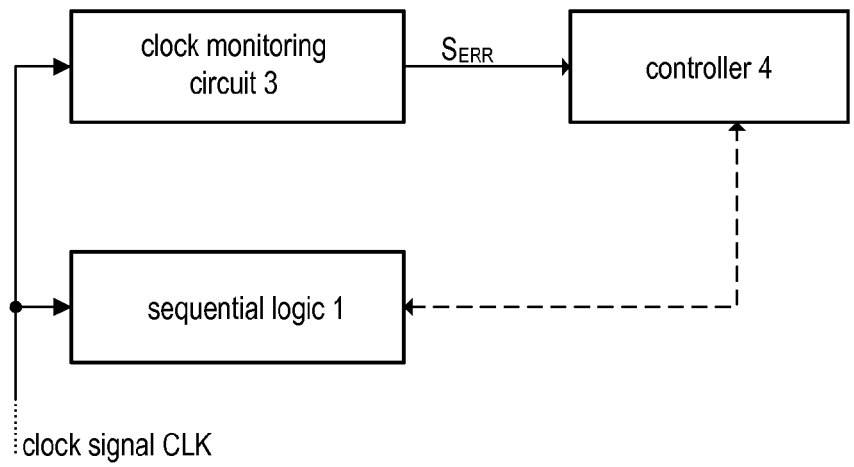
FIG. 2 is a block diagram illustrating a system including a sequential logic circuit, a monitor circuit for monitoring the function of the sequential logic and a further monitor circuit for monitoring the clock signal used by the sequential logic and the monitor circuit.

FIG. 2 illustrates one example circuit arrangement including a first clocked circuit 1, e.g. a sequential logic circuit 1 (see, e.g., FIG. 1), and a clock monitoring circuit 3. The clock monitoring circuit 3 is configured to monitor the clock signal CLK, which is used to operate the sequential logic circuit 1, and to detect whether, or not, the frequency $f_{CLK}$ of the clock signal CLK is within the allowable frequency range. The circuit arrangement further includes a higher level controller 4, which is configured to communicate with the sequential logic circuit 1 and the clock monitor circuit 2, e.g. via a serial bus. When the clock monitoring circuit 3 detects that the clock signal CLK has a frequency $f_{CLK}$ outside the allowable range, it will signal a clock error to the controller 4 (see FIG. 2, error signal $S_{ERR}$ received by the controller 4).

Figure 3:
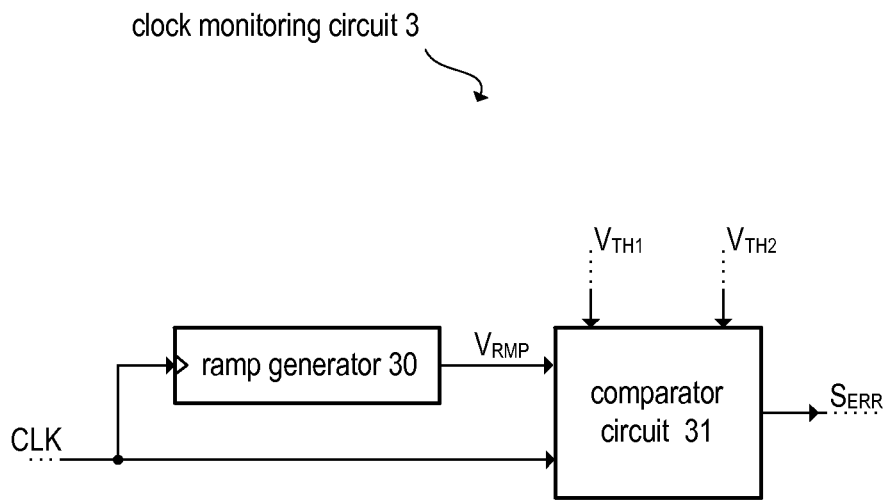
FIG. 3 illustrates one example monitor circuit for monitoring the clock signal used by the sequential logic circuit.

FIG. 3 illustrates one example of the monitor circuit 3. Accordingly, the monitor circuit 3 includes a ramp generator 30 and a comparator circuit 31. The ramp generator 30 is configured to generate a ramp-shaped pulse in each clock cycle of the clock signal CLK (e.g., a sawtooth shaped signal $S_{RMP}$). The comparator circuit 31 receives the signal $S_{RMP}$ (sequence of ramp-shaped pulses) and compares the signal level $V_{RMP}$ of the signal $S_{RMP}$ (comparator input signal) with at least two threshold values $V_{TH1}$, $V_{TH2}$ at specific time instants, which are defined by the clock signal CLK (e.g. the time instants of the falling edges of the clock signal CLK, see FIG. 4). In the present example, the voltage level $V_{RMP}$ of signal $S_{RMP}$ is compared—at a specific time instant in each clock cycle of the clock signal CLK—with an upper threshold $V_{TH1}$ and a lower threshold $V_{TH2}$. The specific time instants may be, for example, the time instants of the rising or the falling edges of the clock signal CLK. If the signal level $V_P$ at the specific time instants is between the thresholds $V_{TH1}$ and $V_{TH2}$, then the frequency $f_{CLK}$ of the clock signal CLK is within the allowable range. When the signal level $V_P$ at the specific time instants exceeds the upper threshold $V_{TH1}$ then the frequency $f_{CLK}$ is too low. When the signal level $V_P$ at the specific time instants falls below the lower threshold $V_{TH2}$ then the frequency $f_{CLK}$ is too high. In both cases an error will be signaled by setting the error signal $S_{ERR}$ to an appropriate logic level (e.g. $S_{ERR}=1$).

It should be noted that the ramp generator does not necessarily generate a ramp signal with a constant slope (linearly rising or falling ramp). The ramp signal may also be composed of exponentially rising or falling pulses (e.g. obtained as capacitor voltage while charging or discharging a capacitor by a constant voltage source via a resistor), triangular pulses or any other pulses having a monotonously rising or falling slope. Generally, the signal level of the pulses, of which signal $S_{RMP}$ is composed, may rise monotonously from a minimum level (e.g. zero) to a maximum level before being reset to the minimum level (upward ramp). Alternatively, the signal level of the pulses may, in each cycle, fall monotonously from a maximum to a minimum level before being reset to the maximum level (downward ramp).

Figure 4:
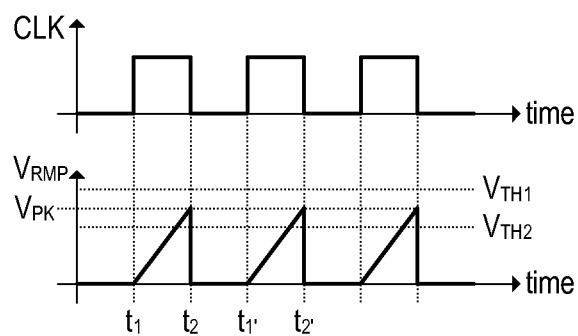
FIG. 4 includes timing diagrams illustrating example waveforms of the clock signal and the ramp signal present in the circuit of FIG. 2, wherein the voltage level of the ramp signal (representing the clock frequency or the on-time of a clock cycle) is within the specified interval.

The function of the example circuit of FIG. 3 is explained in more detail with reference to the timing diagrams of FIGS. 4 to 6. The timing diagrams of FIG. 4 represent a situation, in which the frequency $f_{CLK}$ of the clock signal CLK is within the allowable range, i.e. $f_L < f_{CLK} < f_U$. In the present example, the clock signal CLK is composed of a sequence of rectangular pulses and has a duty cycle of 50 percent. However, different duty cycle values are possible. The time instants of the rising edges of the clock signal CLK are referred to as $t_1$ and $t_1'$, whereas the time instants of falling edges of the clock signal CLK are referred to as $t_2$ and $t_2'$. A new ramp-shaped pulse starts (is triggered) at times $t_1$, $t_1'$, i.e. at each rising edge of the clock signal, wherein the ramp of each ramp-shaped pulse has a defined constant slope R (linear ramp). As mentioned above, the slope (or gradient) R is not necessarily constant. In the present example, the voltage level $V_{RMP}$ of the ramp-shaped pulse is reset to its initial value (e.g. zero) at the subsequent falling edge of the clock signal CLK, i.e. at time instants $t_2$, $t_2'$, etc. Therefore, the current signal level $V_{RMP}$ at time instants $t_2$, $t_2'$, etc., of the falling edges of the clock signal CLK, is the peak value $V_P$ of a ramp-shaped pulse and equals $V_P = R \cdot (t_2 - t_1)$ for the first pulse shown in FIG. 3. Assuming a duty cycle of 50 percent, the time interval $t_2 - t_1$ equals half a period of the clock signal CLK, i.e. $t_2 - t_1 = 0.5 \cdot f_{CLK}^{-1}$. Accordingly the peak value $V_P$ can be expressed as $$V_P = R \cdot (t_2 - t_1) = 0.5 \cdot R \cdot f_{CLK}^{-1}. \quad (2)$$

That is, the peak value increases as the clock frequency decreases and vice versa. The mentioned thresholds $V_{TH1}$ and $V_{TH2}$ used by the comparator circuit 31 (see FIG. 3) each represent a corresponding lower and upper frequency limit $f_L$, $f_U$, wherein $V_{TH1} = 0.5 \cdot R \cdot f_L^{-1}$ and $V_{TH2} = 0.5 \cdot R \cdot f_U^{-1}$. In the example of peak value $V_P$ resided between the two thresholds, i.e. $V_{TH2} < V_P < V_{TH1}$ and thus the clock frequency $f_{CLK}$ lies within the allowable frequency range, i.e. $f_L < f_{CLK} < f_U$.

Figure 5:
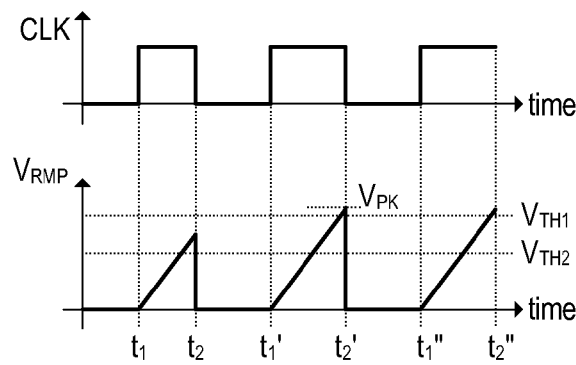
FIG. 5 includes timing diagrams illustrating example waveforms of the clock signal and the ramp signal present in the circuit of FIG. 2, wherein the voltage level of the ramp signal exceeds an upper limit.

FIG. 5 illustrates example waveforms of the clock signal CLK and the signal $V_{RMP}$ for a situation, in which the clock frequency $f_{CLK}$ falls below the lower frequency limit $f_L$. Accordingly, the time $t_2' - t_1'$ is increased as compared to the previous example of FIG. 4. As a consequence, the peak voltage $V_P$ of the second pulse ($V_P = R \cdot (t_2' - t_1')$ is higher than in the previous example and exceeds the threshold value $V_{TH1}$, i.e. $R \cdot (t_2' - t_1') > V_{TH1}$, and consequently the clock frequency $f_{CLK}$ is below the lower frequency limit $f_L$. Consequently, the comparator circuit 31 signals a clock error at time instant $t_2'$ by setting the error signal $S_{ERR}$ to an appropriate logic level. FIG. 6 illustrates example waveforms of the clock signal CLK and the signal level $V_{RMP}$ for a situation, in which the clock frequency $f_{CLK}$ exceeds the upper frequency limit $f_U$. As a consequence, the peak voltage $V_{PK}$ of the second pulse ($V_P = R \cdot (t_2' - t_1')$) is lower than in the previous example of FIG. 4 and falls below the threshold value $V_{TH2}$, i.e. $R \cdot (t_2' - t_1') < V_{TH2}$, and thus the clock frequency $f_{CLK}$ is detected as being above the upper frequency limit $f_U$. Consequently, the comparator circuit 31 signals a clock error at time instant $t_2'$ by setting the error signal $S_{ERR}$ to an appropriate logic level. It should be noted, that the comparator circuit 31 is clocked to compare the sawtooth signal $V_{RMP}$ at the falling edges of the clock signal CLK right before the signal $V_{RMP}$ drops to zero. The comparator circuit 31 stores the result of the comparison until the next clock cycle.

Figure 6:
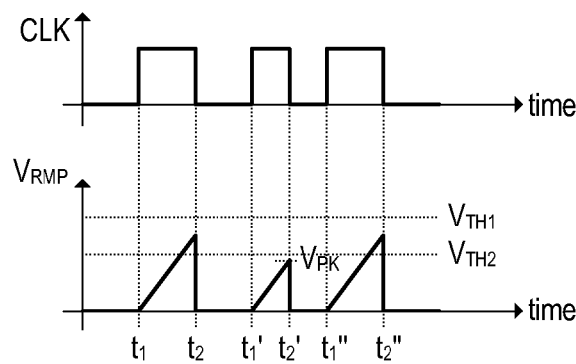
FIG. 6 includes timing diagrams illustrating example waveforms of the clock signal and the ramp signal present in the circuit of FIG. 2, wherein the voltage level of the ramp signal falls below an lower limit.
Figure 7:
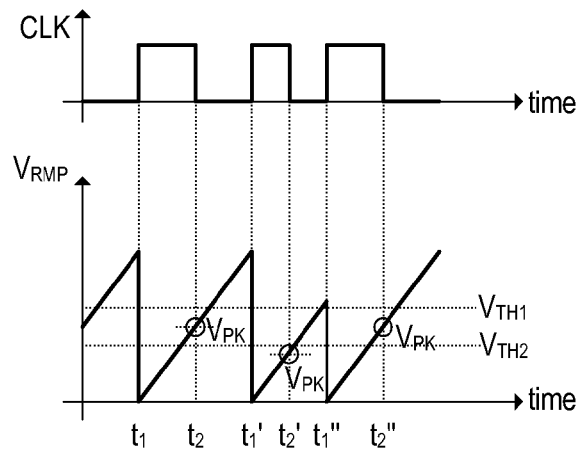
FIG. 7 includes timing diagrams illustrating an alternative to the example of FIG. 6.

FIG. 7 illustrates an example alternative to the example of FIG. 6. Similar to the previous example, FIG. 7 illustrates example waveforms of the clock signal CLK and the signal level $V_{RMP}$ for a situation, in which the clock frequency $f_{CLK}$ exceeds the upper frequency limit $f_U$ between $t_1'$ and $t_1''$. Different from the previous example of FIG. 6, the level $V_{RMP}$ of the ramp signal is not reset at the falling edges (time instants $t_2, t_2', t_2''$) but at the rising edges (time instants $t_1, t_1', t_1''$) of the clock signal CLK. Nevertheless, comparisons between the current level $V_{RMP}$ of the ramp signal and the threshold levels $V_{TH1}$ and $V_{TH2}$ are still triggered by the falling edges of clock signal CLK (i.e. at time instants $t_2, t_2', t_2''$). Analogously to the previous example of FIG. 6, the voltage level $V_{RMP}(t_2')$ at time instant $t_2'$ is below the second threshold $V_{TH2}$ ($R \cdot (t_2'-t_1'') < V_{TH2}$) and, as a result, the clock frequency $f_{CLK}$ is detected as being above the upper frequency limit $f_U$.

Figure 8:
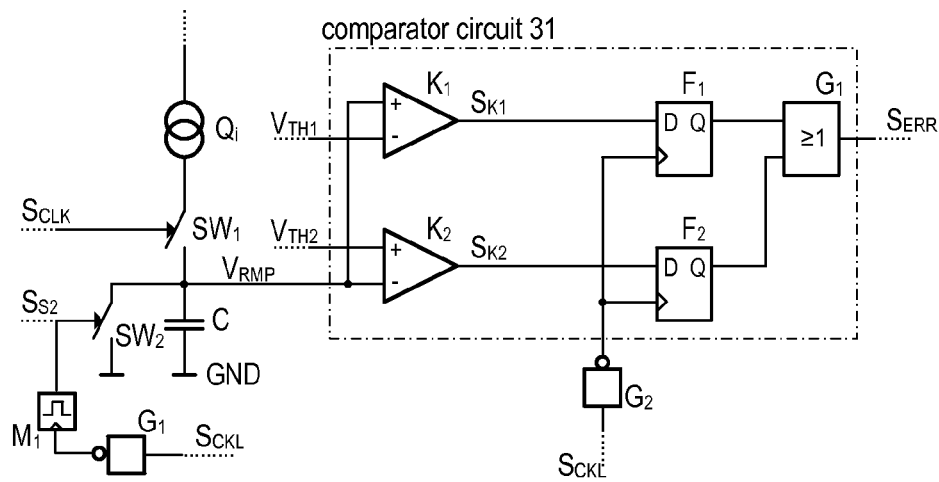
FIG. 8 illustrates the circuit of FIG. 2 in more detail.

FIG. 8 illustrates one example of the clock monitor circuit (see FIG. 2) in more detail. In the present example, the ramp generator is essentially formed by a constant current source $Q_i$ and a capacitor C, which is coupled to the current source $Q_i$ via a first switch $SW_1$. The capacitor C is charged by the constant current $i_C$ provided by the current source, thereby generating a voltage $V_{RMP}$ across the capacitor C, which has a slope R equal to the product of the constant current $i_C$ and the capacitance of the capacitor C. The first switch $SW_1$ is closed while the clock signal CLK is at a high level, that is the voltage level of the signal $S_{RMP}$ increases linearly between time instants $t_1$ and $t_2$ (and also between $t_1'$ and $t_2'$, etc., see FIG. 4). A switch $SW_2$ is connected parallel to the capacitor C, and the capacitor is discharged as soon as switch $SW_2$ is closed. In the present example, the switch $SW_2$ is closed for a defined time after each falling edge in the clock signal CLK. This respective drive signal $S_{S2}$ for switch $SW_2$ is, for example, generated from the clock signal CLK using the inverter $G_3$ and the mono-flop $M_1$. Accordingly, the mono-flop $M_1$ generates a pulse for closing the switch $SW_2$ in response to each rising edge of the inverted clock signal (i.e. in response to a falling edge of the non-inverted clock signal CLK). The switches $SW_1$ and $SW_2$ are implemented using transistors such as, for example, MOSFETs.

In the example of FIG. 8, the comparator circuit 31 is formed by the comparators $K_1$ and $K_2$ whose output values $S_{K1}, S_{K2}$ are stored using latches $F_1$ and $F_2$. The output of the latches $F_1$ and $F_2$ are combined by an or-gate $G_1$. The latches are edge-triggered by the rising edges of the inverted clock signal CLK. The voltage $V_{RMP}$ across the capacitor C is supplied to the comparators $K_1$ and $K_2$. Comparator $K_1$ is configured to compare the voltage $V_{RMP}$ with the first threshold $V_{TH1}$, and comparator $K_2$ is configured to compare the voltage $V_{RMP}$ with the second threshold $V_{TH2}$. The first comparator $K_1$ is triggered (i.e. the comparator output changes from a low level to a high level) when the voltage $V_{RMP}$ exceeds the first threshold $V_{TH1}$, whereas the second comparator $K_2$ is triggered when the voltage $V_{RMP}$ falls below the second threshold $V_{TH2}$. The result of the comparison is stored only at discrete time instants, i.e. at the time instants of the falling edges of the clock signal CLK (see FIGS. 4-7, time instants $t_2, t_2', t_2''$). In essence, the voltage levels $V_{RMP}$ of the ramp-shaped pulses at the time instants of the falling edges of the clock signal CLK are compared with the thresholds $V_{TH1}$ and $V_{TH2}$. As explained with reference to FIGS. 4 to 6, the output of the or-gate $G_1$ may be used as error signal $S_{ERR}$, which is indicative of whether or not the clock frequency is within the allowable frequency range. As mentioned above, the comparator outputs $S_{K1}, S_{K2}$, need not necessarily be latched at the time instants of the falling edges of the clock signal. Alternatively, the latches may be triggered at the time instants of the rising edges of the clock signals or at any other time specific instant within a clock cycle of the clock signal CLK (e.g. a specific delay time after the rising edge of a clock signal).

In the example of FIG. 8, the latches $F_1, F_2$ store the output of each individual comparator $K_1, K_2$. As a first alternative, a single latch could be connected downstream to the or-gate $G_1$ instead of the two latches $F_1$ and $F_2$. In this case the output signals $S_{K1}, S_{K2}$ of the comparators $K_1$ and $K_2$ can be directly supplied to the or-gate $G_1$. As a second, more complex, alternative, the latches $F_1, F_2$ could be omitted and a sample-and-hold circuit could be connected between capacitor C and the comparators $K_1, K_2$, such that the capacitor voltage $V_{RMP}$ is sampled and held at the time instants of, e.g., the falling edges of the clock signal CLK.

Figure 9:
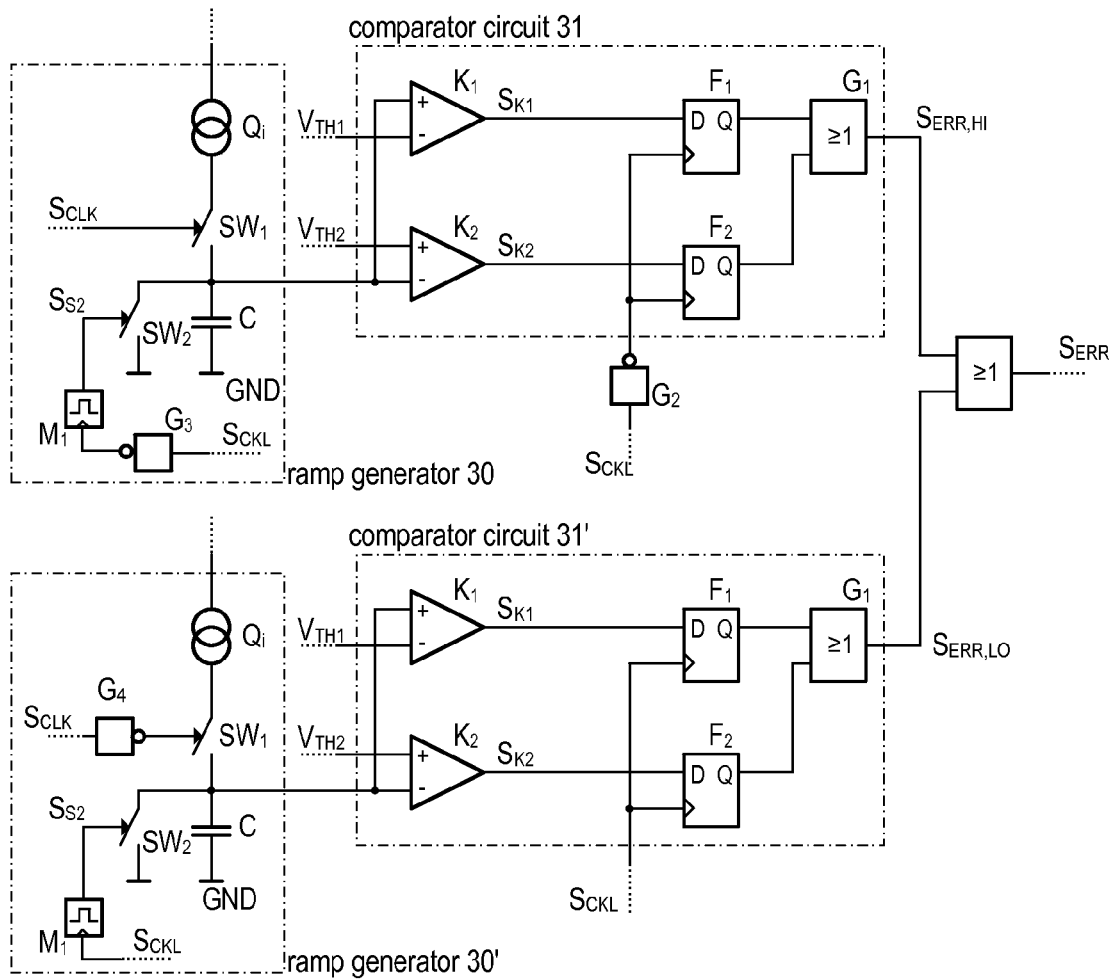
FIG. 9 illustrates an enhanced version of the circuit of FIG. 8.

In the example of FIG. 8, only the on-time of the clock signal CLK is monitored. The on-time is the time span, during which the signal level of the clock signal is high (see FIG. 4, from $t_1$ to $t_2$), whereas the off time is the time span during which the signal level is low (see FIG. 4, from $t_2$ to $t_1'$). Alternatively, the off-time of the clock signal CLK may be monitored when inverting the clock signal CLK before supplying to the monitoring circuit 3 (see FIG. 2). Additionally, both, on-time and off-time, may be monitored when the monitoring circuit is duplicated. In the example of FIG. 9, the circuit shown in FIG. 8 is provided twice. The ramp generator 30 generates ramp-shaped pulses at each rising edge of the clock signal CLK, whereas the ramp generator 30' generates ramp-shaped pulses at each falling edge of the clock signal CLK. Similarly, the comparator circuit 30 compares the level of the capacitor voltage $V_{RMP}$ at each falling edge of the clock signal CLK, whereas comparator circuit 30 compares the level of the capacitor voltage $V_{RMP}$ at each rising edge of the clock signal. For this purpose the clock signal is inverted (inverter $G_4$) before being supplied to switch SW1 of ramp generator 30', whereas inverters $G_3$ and $G_2$ are not needed in ramp generator 30'. The output signals $S_{ERR,HI}$ and $S_{ERR,LO}$ provided by the two comparator circuits 31, 31' may finally be combined by a further or-gate $G_5$. The output of or-gate $G_5$ indicates an error detected during the on-times of the clock signal CLK or the off-times of the clock signal.

Although the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated example implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. A monitor circuit for monitoring a clock signal, the monitor circuit comprises:
    a pulse generator configured to generate a sequence of pulses synchronous to the clock signal, each pulse having a slope with a monotonously rising or falling signal level; and
    a comparator circuit receiving the sequence of pulses and configured to detect, for each clock cycle of the clock signal, whether or not the signal level of the sequence of pulses is outside a desired range at a specific time instant within the clock cycle of the clock signal, wherein the comparator circuit includes a first comparator and a second comparator for comparing the signal level of the sequence of pulses with a first threshold and a second threshold, respectively.

2. The monitor circuit of claim 1, wherein the pulse generator is configured to generate a sequence of pulses, each pulse having a slope with a constant gradient.

3. The monitor circuit of claim 1, wherein the pulse generator comprises a capacitor, which is charged and discharged synchronously to the clock signal.

4. The monitor circuit of claim 1, wherein the pulse generator comprises a capacitor, which is charged by a constant current during an on-time or an off-time of the clock signal.

5. The monitor circuit of claim 1, wherein the comparator circuit includes a gate coupled to outputs of the first and the second comparator.

6. The monitor circuit of claim 1, wherein the comparator circuit includes at least one latch coupled downstream to the first comparator, the at least one latch being triggered regularly synchronously to the clock cycle.

7. The monitor circuit of claim 1, wherein the comparator circuit is configured to signal an error when the signal level is detected as being outside the desired range.

8. A method for monitoring a clock signal, comprising:
    generating a sequence of pulses synchronous to the clock signal, each pulse having a slope with a monotonously rising or falling signal level; and
    in each clock cycle of the clock signal, detecting whether or not the signal level of the sequence of pulses is outside a desired range at a specific time instant within the clock cycle of the clock signal,
    wherein detecting whether or not the signal level of the sequence of pulses is outside a desired range comprises comparing the signal level of the sequence of pulses with a first threshold and a second threshold, wherein the signal level is outside the desired range when it is higher than the first threshold or lower than the second threshold.

9. The method of claim 8, wherein detecting whether or not the signal level of the sequence of pulses is outside a desired range comprises:
    comparing the signal level of the sequence of pulses with a first threshold and a second threshold with a first and a second comparator, respectively,
    latching an output signal of the first comparator or of the second comparator or the output signals of both, the first and the second comparator.

10. The method of claim 8, wherein latching the output signals of both comparators includes:
    combining the output signals of the first comparator and the second comparator using a gate, and
    latching an output signal of the gate.

11. A circuit arrangement, comprising:
    a sequential logic circuit receiving a clock signal,
    a controller configured to communicate with the sequential logic circuit; and
    a monitor circuit for monitoring the clock signal, which comprises:
        a pulse generator configured to generate a sequence of pulses synchronous to the clock signal, each pulse having a slope with a monotonously rising or falling signal level; and
        a comparator circuit receiving the sequence of pulses and configured to detect, for each clock cycle of the clock signal, whether or not the signal level of the sequence of pulses is outside a desired range at a specific time instant within the clock cycle of the clock signal,
    wherein the comparator circuit includes a first comparator and a second comparator for comparing the signal level of the sequence of pulses with a first threshold and a second threshold, respectively.

12. The circuit arrangement of claim 11, wherein the comparator circuit includes a gate coupled to outputs of the first comparator and the second comparator.

* * * * *